United States Patent
Yang et al.

(10) Patent No.: US 7,586,126 B2
(45) Date of Patent: Sep. 8, 2009

(54) LIGHT EMITTING DIODE LIGHTING MODULE WITH IMPROVED HEAT DISSIPATION STRUCTURE

(75) Inventors: Shu Jung Yang, Tainan County (TW); Ran Min Tain, Taipei County (TW)

(73) Assignee: Industrial Technology Research Institute, Hsinchu County (TW)

( * ) Notice: Subject to any disclaimer, the term of this patent is extended or adjusted under 35 U.S.C. 154(b) by 0 days.

(21) Appl. No.: 11/531,234

(22) Filed: Sep. 12, 2006

(65) Prior Publication Data
US 2008/0023720 A1    Jan. 31, 2008

(30) Foreign Application Priority Data
Jul. 26, 2006    (TW) ............................. 95127256 A

(51) Int. Cl.
*H01L 33/00* (2006.01)
*H01L 23/46* (2006.01)

(52) U.S. Cl. ................... 257/88; 257/99; 257/713; 257/714; 257/E33.055; 257/E33.075; 257/E23.097; 362/555

(58) Field of Classification Search ................. 257/88, 257/99, 713, 714, E33.055, E33.075, E23.097; 362/555
See application file for complete search history.

(56) References Cited

U.S. PATENT DOCUMENTS

| 6,661,032 B2 * | 12/2003 | Meng et al. ............. 257/99 |
| 6,956,740 B2 * | 10/2005 | Shimura et al. ......... 361/700 |
| 7,253,447 B2 * | 8/2007 | Oishi et al. ............. 257/99 |
| 2005/0218514 A1 * | 10/2005 | Massingill ............. 257/737 |
| 2006/0002142 A1 | 1/2006 | Jeong et al. |
| 2006/0139935 A1 * | 6/2006 | Huang .................. 362/373 |
| 2007/0019419 A1 * | 1/2007 | Hafuka et al. ......... 362/373 |

FOREIGN PATENT DOCUMENTS

| EP | 1523041 A1 | 4/2005 |
| JP | 361156754 | * 7/1986 |
| JP | 2005-317480 | 10/2005 |
| JP | 2006-019557 | * 1/2006 |
| TW | I271885 | 10/2005 |
| TW | M284193 | 12/2005 |

OTHER PUBLICATIONS

Taiwan Office Action dated Feb. 27, 2009 Cites Taiwan Application No. 1271885 (cited above).

* cited by examiner

*Primary Examiner*—Victor A Mandala
(74) *Attorney, Agent, or Firm*—WPAT, P.C.; Anthony King; Kay Yang

(57) ABSTRACT

A light emitting diode (LED) lighting module with an improved heat dissipative structure comprises a plurality of the LEDs and a heat pipe apparatus on which at least a circuit layer is provided. The circuit layer is directly formed on an electrical insulation layer with superior heat conductivity on a surface of the heat pipe apparatus. The LEDs are electrically connected to the circuit layer. Furthermore, the heat pipe apparatus can be a flat heat pipe or the combination of plate-shaped heat pipes, heat sinks and a fan. Because the LEDs are directly mounted on the surface of the heat pipe apparatus, the heat generated by the lighting LEDs is effectively delivered to the atmosphere due to the reaction of latent heat phase transformation in the heat pipe apparatus. Moreover, the heat is delivered to the heat sinks at far sides for heat exchange so that improved heat dissipation and a space saving result are achieved.

22 Claims, 7 Drawing Sheets

LIGHT EMITTING DIODE LIGHTING MODULE WITH IMPROVED HEAT DISSIPATION STRUCTURE

BACKGROUND OF THE INVENTION

1. Field of the Invention

The present invention relates to an LED lighting module with a heat dissipation structure, and more particularly relates to a module having LEDs served as its light source and combined with a highly efficient heat dissipation structure.

2. Description of the Related Art

A light emitting diode (LED) is a highly efficient luminescent component for converting the electric energy into light energy, and also is a micro solid-state light source. The main portion of an LED device is a semiconductor p-n junction structure. After the two ends of the junction are applied with a voltage, the photon energy is emitted and the light ray of a specific wavelength range is emitted through the combination of electrons and holes. Since the LED device has the characteristics of color reproducibility and single wavelength, the LED has become a mainstream technology for improving the spectrum of the back light source for a liquid crystal display (LCD). Moreover, LED devices are also widely applied on an outdoor large display, and will gradually replace the current illumination devices.

When the back light source of an LCD utilizes LEDs as a light source, two common relative position relationships between the LEDs and the illumination surface are a direct type and an edge type. Usually, a large scale LCD adopts the direct type as an illuminating mode of the back light source. A heat dissipation structure of a common direct-type LED backlight module is to mount the LED devices on the surface of a printed circuit board (PCB) and then transfer the heat to heat sinks through heat pipes fixed on another opposite surface of the PCB for heat exchange.

FIG. 1 is a schematic diagram of a cross-sectional structure of a conventional backlight module. An earlier U.S. Patent Publication US 2006/0002142 has disclosed a backlight module 10, which includes LED devices 11, a PCB 12, heat pipes 13 and a bottom cover 14. The surface of the LED devices 11 is mounted on an upper surface of a metal core PCB 12, and the PCB 12 has a circuit layer for driving the LED devices 11 to illuminate. The heat is generated when the LED devices 11 are lighting on, and the heat accumulating in the LED devices 11 will cause their brightness decay. Therefore, the heat is taken away by the heat pipe 13 adhered to the back of the PCB 12, and transferred to a peripheral heat sink (not shown) through a heat path of the bottom cover 14, so as to be delivered to the atmosphere.

Moreover, an ROC Patent publication No. M284193 also discloses a backlight module 20, as show in FIG. 2. The backlight module 20 includes a plurality of LED devices 21 mounted on a PCB 22, and heat pipes 23 are adhered to a lower surface of the PCB 22. Heat sinks 24 are disposed at the periphery of the heat pipe 23, which deliver the heat taken away by the heat pipe from the PCB 22 to the atmosphere. A similar heat dissipation structure is also disclosed by the Japanese Patent Publication No. JP 2005317480.

However, the above conventional arts have the same heat dissipation paths, that is, the heat generated by the LED devices is transferred to the heat pipes via the PCB. However, either a cladding layer or an insulation layer of the PCB is made of the material of low heat conductivity, such as solder mask or resin, which causes a large thermal resistance of the PCB, thus the heat generated by the LED devices cannot be quickly and effectively transferred to the heat pipe. Even if the PCB is changed into a metal core PCB having lower thermal resistance, the heat generated by the LED still needs to pass through each lamination material of the metal core PCB and through the adhesive material or solder of the interface, and then reaches the heat pipe.

Therefore, an LED lighting module for shortening the heat conducting path and reducing the corresponding total thermal resistance is urgently needed in the LED application field, through which the heat generated by the LED devices may be directly and quickly transferred to the heat pipes, so as to improve the LED reliability and the luminous efficiency of the LED devices.

SUMMARY OF THE INVENTION

An objective of the present invention is to provide an LED lighting module having high dissipation efficiency. An insulation layer and a metal circuit layer are directly formed on the surface of a plate-shaped heat pipe or a flat heat pipe, thus the heat generated by LED devices or dies mounted on a circuit layer is quickly and directly transferred to the heat pipe. The LED lighting module with preferred heat dissipation performance may be widely applied on a back light source of a liquid crystal display panel, and may also be used as a public display, an illumination apparatus and the like.

Another objective of the present invention is to provide an LED lighting module with a heat dissipation structure of a low cost, wherein a plurality of LED devices are directly mounted on a plate-shaped heat pipe and electrically connected to a PCB. Thus, the LED lighting module may use the existing plate-shaped heat pipe and PCB, and have the characteristics of high heat dissipation efficiency, thus it is indeed a competitive LED lighting module.

In order to achieve the above objectives, an LED lighting module with a heat dissipation structure is provided, which comprises a plurality of LEDs and a heat pipe apparatus with at least one circuit layer on the surface. The circuit layer is directly formed on an electrical insulation layer with superior heat conductivity on a surface of the heat pipe apparatus. The plurality of LEDs are electrically connected to the circuit layer. Furthermore, the heat pipe apparatus is a flat heat pipe or a combination of a plurality of plate-shaped heat pipes, heat sinks and a fan, and the heat pipe may be bent or compressed according to the requirement of the design. Because the plurality of LEDs is directly mounted on the surface of the heat pipe apparatus, due to the reaction of latent heat phase transformation in the heat pipe apparatus, the heat generated by the lighting LEDs is effectively delivered to the atmosphere or delivered to the heat sinks at far sides for heat exchange, so that improved heat dissipation and a space saving result are achieved.

BRIEF DESCRIPTION OF THE DRAWINGS

The invention will be described according to the appended drawings in which.

DETAILED DESCRIPTION OF THE INVENTION

Figure 1:
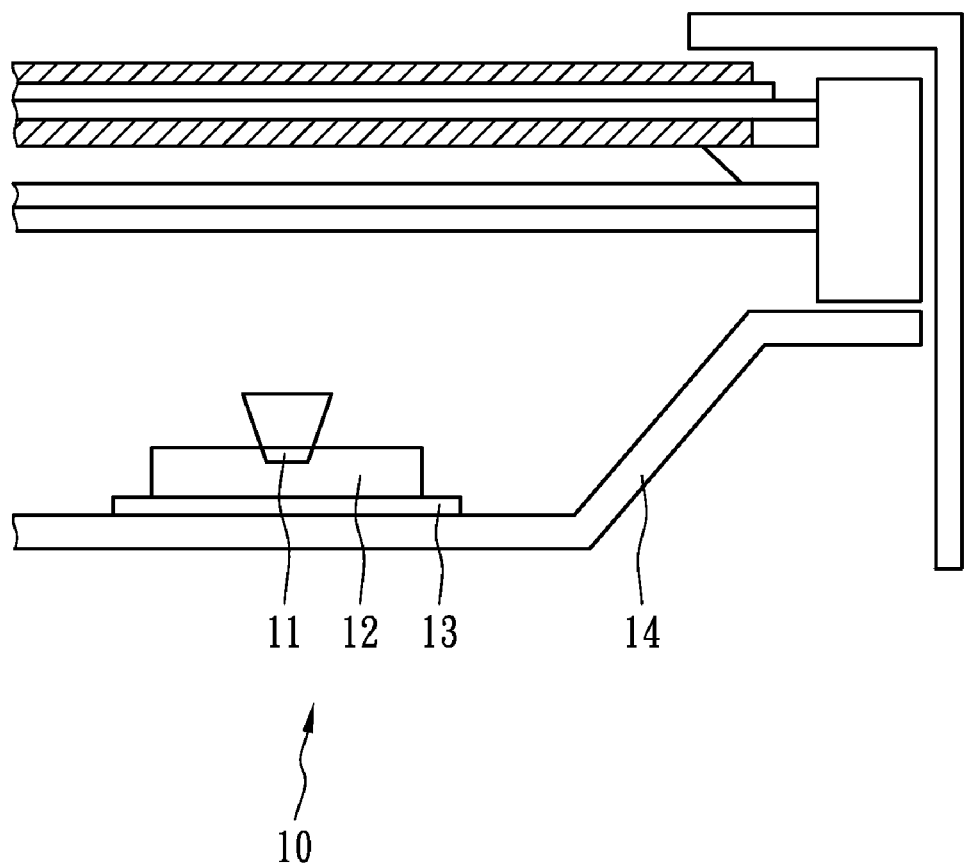
FIG. 1 is a schematic diagram of a cross-sectional structure of a conventional backlight module.
Figure 2:
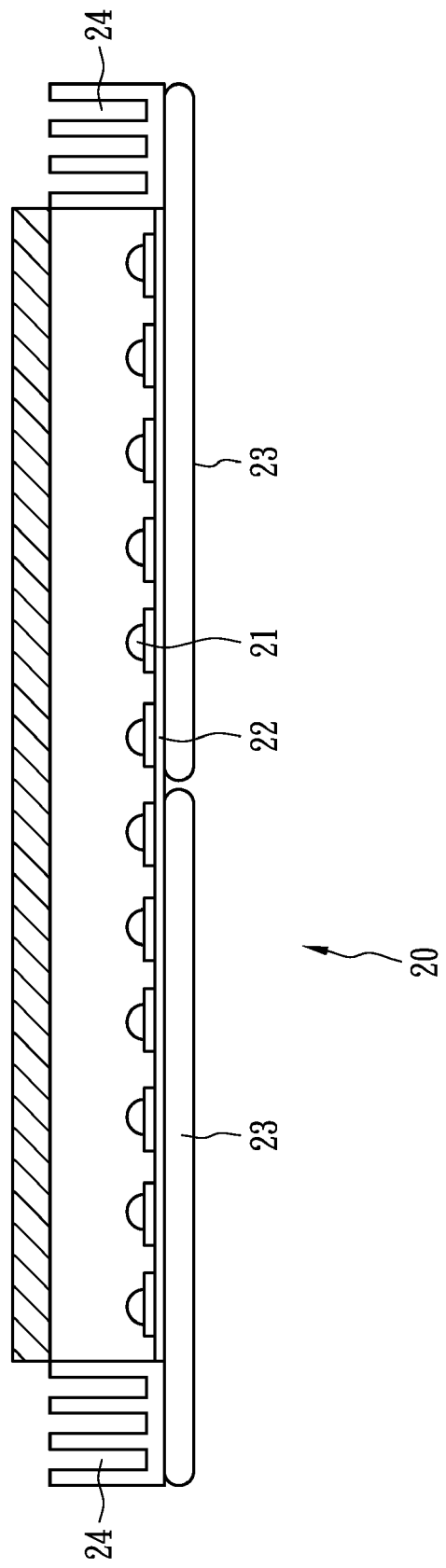
FIG. 2 is a schematic diagram of a cross-section structure of another conventional backlight module.
Figure 3:
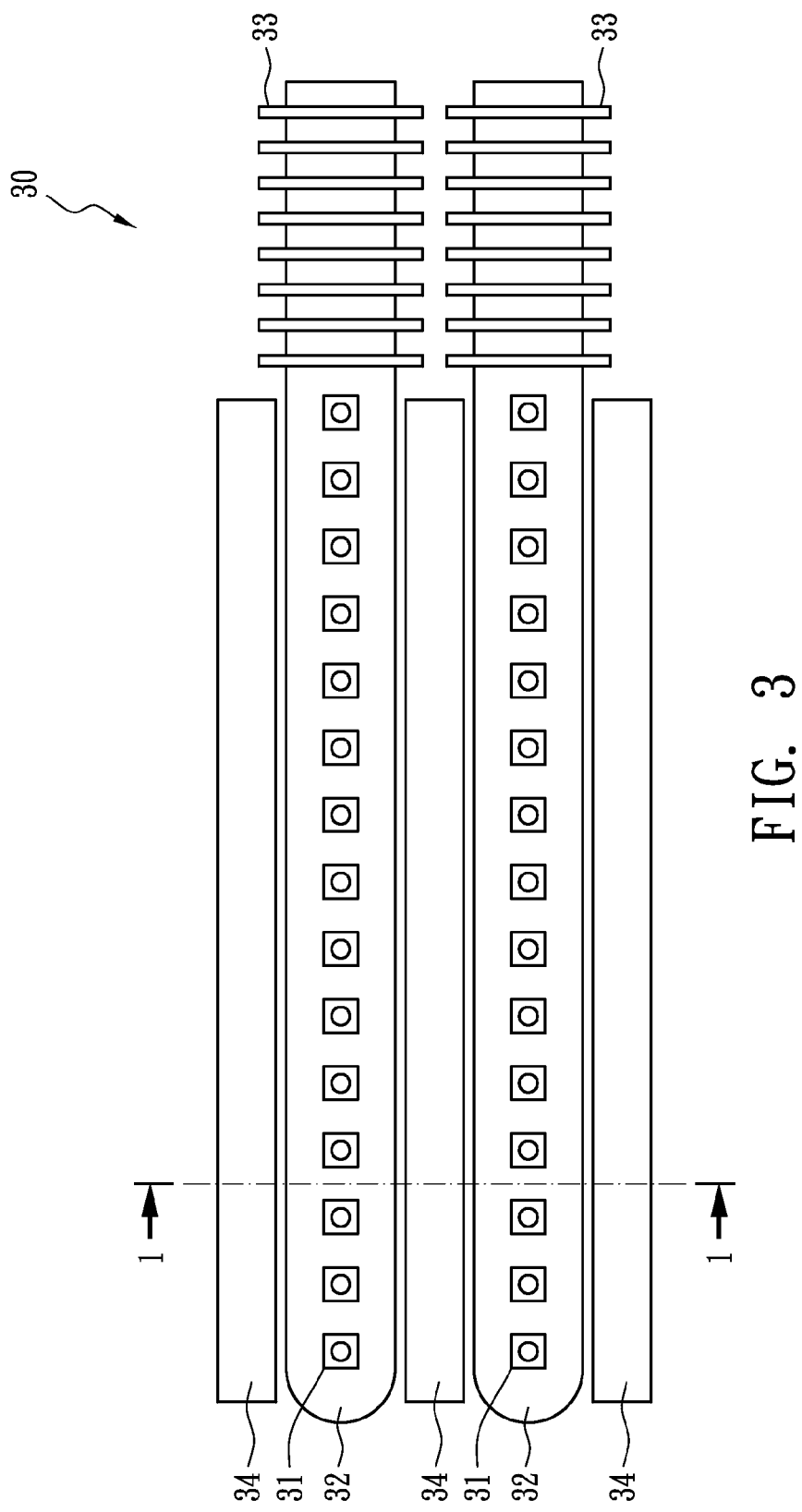
FIG. 3 is a top view of an LED lighting module with a heat dissipation structure in accordance with the present invention.

FIG. 3 is a top view of an LED lighting module with a heat dissipation structure in accordance with the present invention. The LED lighting module 30 includes a plurality of LED devices 31 and at least one heat pipe 32, and further includes a plurality of heat sinks 33 and a plurality of reflecting plates 34 for improving the utilization rate of light. The heat generated from the lighting LED devices 31 is directly transferred to the condensation region equipped with the heat sinks 33 through the heat pipes 32, and delivered to the atmosphere through the heat sinks 33. The heat pipe 32 is made of metal of superior heat conductivity such as copper or aluminum, which has a working substance therein for performing a latent heat phase transformation between liquid and vapor. Thus the heat generated by the LED devices 31 may be transferred to a heating region of the heat pipe 32 by means of a heat conduction, the liquid working substance in the pipe has a phase transformation quickly to be vaporized after absorbing sufficient heat, and the heat is transferred to the condensation region by the rapid moving of the vapor. Afterward, the heat is immediately taken away through the heat sinks 33 in the manner of natural convection, so as to further improve heat dissipation. If a fan (not shown) is additionally mounted at the heat sinks 33 to have a forced convection effect, the heat dissipation rate is increased.

Figure 4:
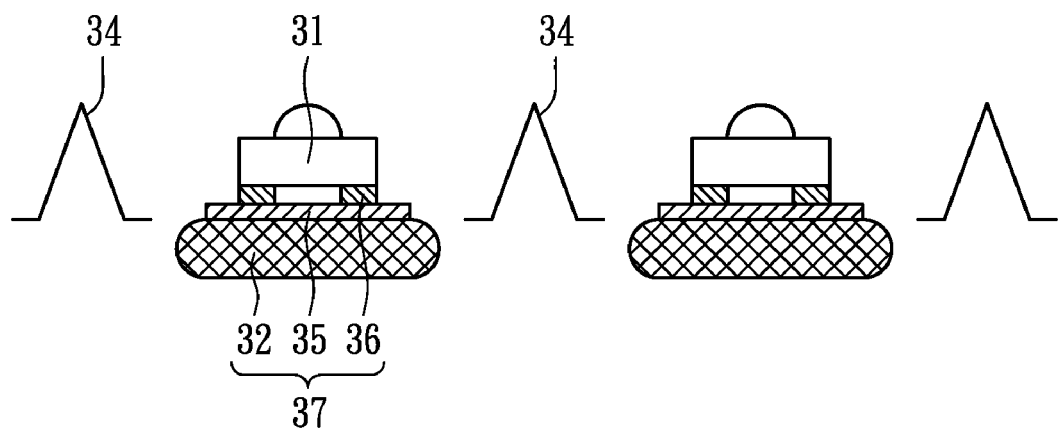
FIG. 4 is a schematic cross-sectional view taken along the section line 1-1 in FIG. 3.

FIG. 4 is a schematic cross-sectional diagram taken along the section line 1-1 in FIG. 3. At least one electrical insulation layer 35 is overlaid on the upper surface of the heat pipe 32, such as a ceramic material or a metal oxide ($Al_2O_3$), and then a circuit layer 36 is formed on the electrical insulation layer 35 by a coating-printing or stacking step. The heat pipe 32, the electrical insulation layer 35 and the circuit layer 36 comprise a heat pipe apparatus 37 together. Furthermore, an upper electrical insulation layer and an upper circuit layer (not shown) are further sequentially formed on the circuit layer 36, and the LED device 31 is directly electrically connected to the upper circuit layer. Thus, multiple circuit layers can be provided on the surface of the heat pipe 32, so as to enhance the function and application of the LED lighting module 30. Due to the superior heat conductivity of the ceramic material, the heat generated by the LED devices 31 is conducted to the heat pipes 32 via the electrical insulation layer 35. In comparison with the PCB used in the aforesaid conventional arts, the present invention not only simplifies the heat-conducting path, and further greatly reduces the total thermal resistance.

Figure 5:
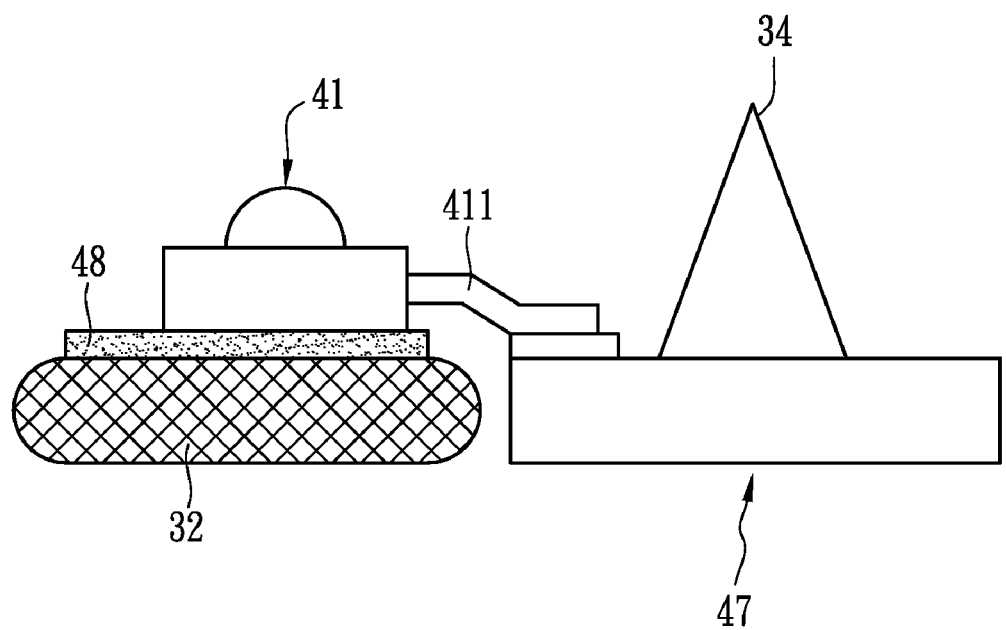
FIG. 5 is a cross-sectional view of the LED lighting module with a heat dissipation structure in accordance with a second embodiment of the present invention.

As shown in FIG. 5, an LED lighting module 30 uses the existing components and has the characteristics of high heat dissipation efficiency. FIG. 5 is a cross-sectional diagram of the LED lighting module with a heat dissipation structure according to a second embodiment of the present invention. A plurality of LED devices 41 are directly mounted on the surface of the heat pipe 32 by a solder 48 or a silver paste of superior heat conductivity. The leads 411 of the LED devices 41 laterally extend to a PCB 47, and are electrically connected to the PCB 47. Likewise, in order to improve the utilization rate of light, a reflecting plate 34 is disposed on the PCB 47, such that the light emitted by the LED devices 41 may be concentratedly directed upwards.

Figure 6A:
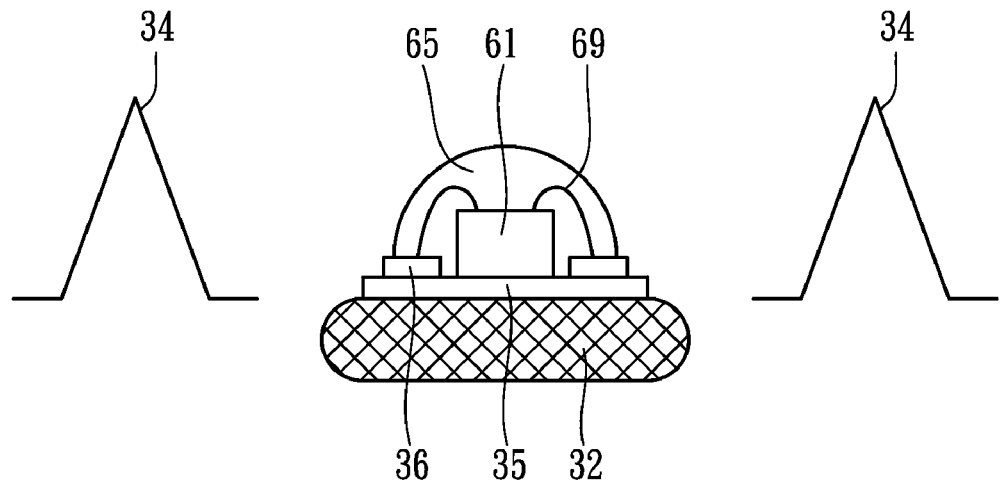
FIG. 6(a) is a cross-sectional view of the LED lighting module with a heat dissipation structure in accordance with a third embodiment of the present invention.

In comparison with FIG. 4, the LED device 31 may further use a leadframe equipped with a heat dissipation plate to enhance the heat dissipation efficiency of a package. If an LED die is directly mounted on the heat pipe 32, not only the cost for packaging is saved, but also the thermal resistance caused by the packaging material is eliminated. FIG. 6(a) is a cross-sectional diagram of the LED lighting module with a heat dissipation structure according to a third embodiment of the present invention. A plurality of LED bare dies 61 are mounted on the electrical insulation layer 35 on the surface of the heat pipe 32, and a metal wire 69 connects the LED bare dies 61 to a circuit layer 36 by a wire bonding technique. The surface of the LED bare dies 61 and the metal lead 69 may be covered by a transparent material 65, such as resin and silicone rubber, so as to protect the LED bare dies 61 and the metal lead 69.

Figure 6B:
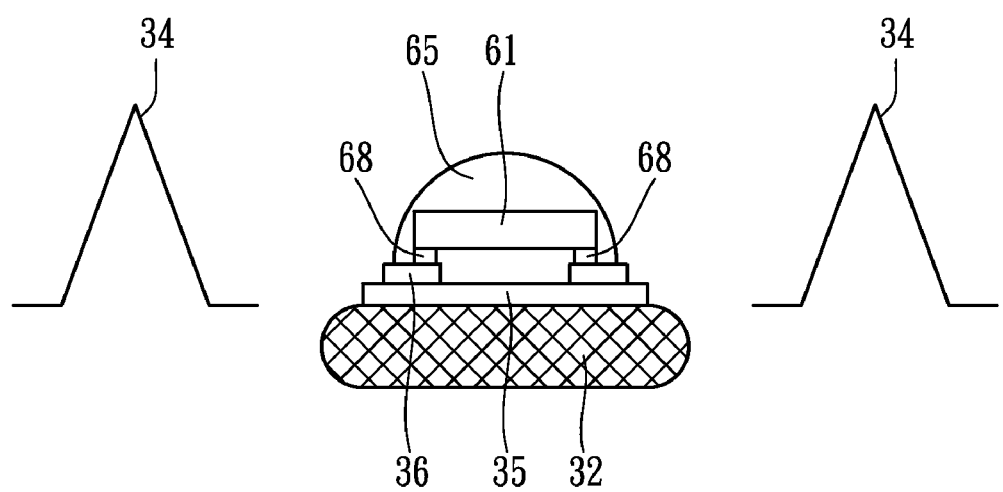
FIG. 6(b) is a cross-sectional view of the LED lighting module with a heat dissipation structure in accordance with a forth embodiment of the present invention.

Furthermore, FIG. 6(b) is a cross-sectional view of the LED lighting module with a heat dissipation structure according to a forth embodiment of the present invention. A plurality of LED bare dies 61 with bumps 68 are directly mounted on the circuit layer 36 on the surface of the heat pipe 32 by a flip chip technology, and the circuit layer is overlaid on the electrical insulation layer 35 as well. Likewise, the cost for packaging is saved and the thermal resistance caused by the packaging material is eliminated. The surface of the LED bare dies 61 may also be covered by a transparent material 65, such as resin and silicone rubber, so as to protect the LED bare dies 61.

Figure 7:
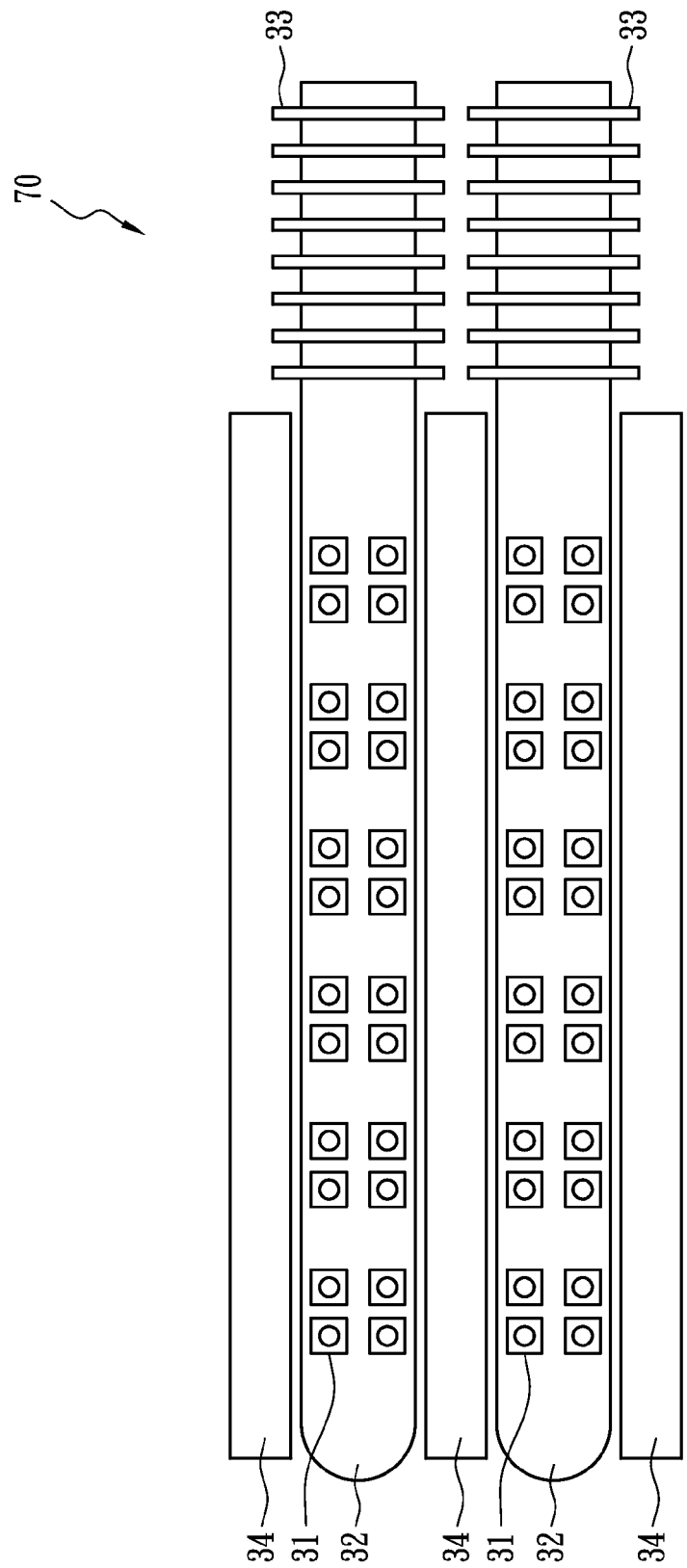
FIG. 7 is a top view of the LED lighting module with a heat dissipation structure in accordance with a fifth embodiment of the present invention.

FIG. 7 is a top view of the LED lighting module with a heat dissipation structure according to a fifth embodiment of the present invention. In comparison with FIG. 3, the LED devices 31 of the LED lighting module 70 are mounted on the surface of the heat pipe 32 in an array. The LED devices capable of emitting different colors (such as red light, blue light and green light) are arranged in a dispersed and interlaced way, and the devices 31 are spaced by a fixed distance with each other, so as to achieve a colorful light emitting effect.

Figure 8:
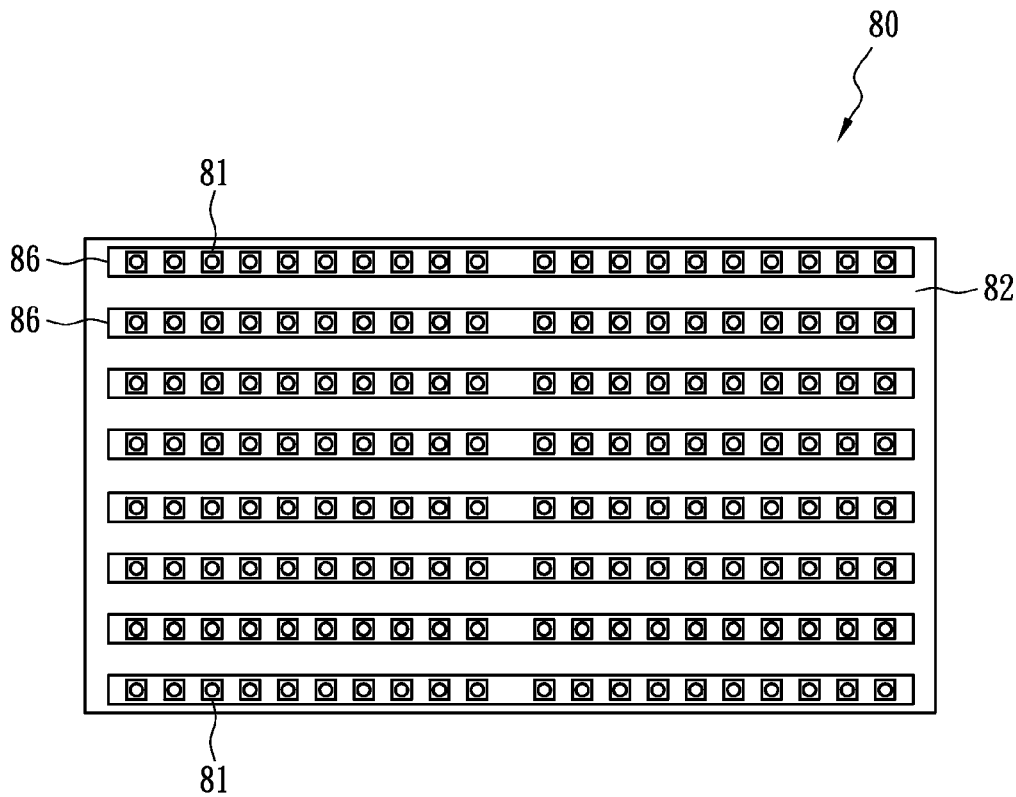
FIG. 8 is a top view of the LED lighting module with a heat dissipation structure in accordance with a sixth embodiment of the present invention.
Figure 9:
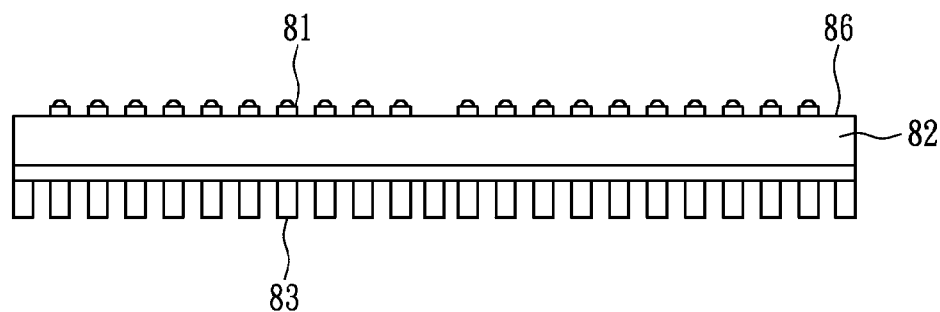
FIG. 9 is a sectional view of the LED lighting module with a heat dissipation structure in accordance with the sixth embodiment of the present invention.

FIG. 8 is a top view of the LED lighting module with a heat dissipation structure according to a sixth embodiment of the present invention. The LED lighting module 80 includes a plurality of LED devices 81 and a flat heat pipe 82, wherein the LED devices 81 are mounted on the region of the metal oxide layer 86 on the flat heat pipe 82. Likewise, a circuit layer (not shown) is provided on the metal oxide layer 86. A large-area heat sink 83 is mounted on the backside of the flat heat pipe 82, and the active area of the heat exchange is further broadened effectively, as shown in the sectional view of FIG. 9.

The above-described embodiments of the present invention are intended to be illustrative only. Numerous alternative embodiments may be devised by persons skilled in the art without departing from the scope of the following claims.

What is claimed is:

1. A light emitting diode (LED) lighting module with a heat dissipation structure, comprising:

a heat pipe apparatus comprising at least one heat pipe, an electrical insulation layer directly formed on a surface of the heat pipe and a circuit layer directly formed on a surface of the electrical insulation layer; and a plurality of LEDs directly mounted on the electrical insulation layer and electrically connected to the circuit layer.

2. The LED lighting module with a heat dissipation structure of claim 1, wherein the LED is a bare die.

3. The LED lighting module with a heat dissipation structure of claim 2, wherein the LED is covered by a transparent material.

4. The LED lighting module with a heat dissipation structure of claim 3, wherein the transparent material is resin or silicone rubber.

5. The LED lighting module with a heat dissipation structure of claim 2, wherein the die is electrically connected to the circuit layer by a metal lead or a bump.

6. The LED lighting module with a heat dissipation structure of claim 1, wherein the LED is a packaged LED device.

7. The LED lighting module with a heat dissipation structure of claim 1, wherein the electrical insulation layer is a ceramic material layer.

8. The LED lighting module with a heat dissipation structure of claim 1, wherein the electrical insulation layer is a metal oxide layer.

9. The LED lighting module with a heat dissipation structure of claim 1, further comprising an upper electrical insulation layer and an upper circuit layer sequentially stacked on the circuit layer, wherein the plurality of LEDs are directly electrically connected to the upper circuit layer.

10. The LED lighting module with a heat dissipation structure of claim 1, wherein the heat pipe apparatus is combined by a plurality of the heat pipes.

11. The LED lighting module with a heat dissipation structure of claim 1, wherein the heat pipe is a flat heat pipe or a plate-shaped heat pipe.

12. The LED lighting module with a heat dissipation structure of claim 1, further comprising at least one heat sink mounted on the surface of the heat pipe apparatus.

13. The LED lighting module with a heat dissipation structure of claim 1, wherein the heat pipe is made of a metal with superior heat conductivity, and wherein the LED lighting module has no radiating plate.

14. The LED lighting module with a heat dissipation structure of claim 1, wherein the heat pipe is made of copper.

15. The LED lighting module with a heat dissipation structure of claim 1, wherein the heat pipe is made of aluminum.

16. An LED lighting module with a heat dissipation structure, comprising:

at least one heat pipe;

at least one printed circuit board (PCB); and a plurality of LEDs directly mounted on a surface of the heat pipe and electrically connected to the PCB.

17. The LED lighting module with a heat dissipation structure of claim 16, wherein the LED is a packaged LED device that has a plurality of leads electrically connected to the PCB.

18. The LED lighting module with a heat dissipation structure of claim 16, wherein the heat pipe is a flat heat pipe or a plate-shaped heat pipe.

19. The LED lighting module with a heat dissipation structure of claim 16, further comprising at least one heat sink mounted on the surface of the heat pipe apparatus.

20. The LED lighting module with a heat dissipation structure of claim 16, wherein the heat pipe is made of a metal with superior heat conductivity.

21. The LED lighting module with a heat dissipation structure of claim 16, wherein the heat pipe is made of copper.

22. The LED lighting module with a heat dissipation structure of claim 16, wherein the heat pipe is made of aluminum.

* * * * *

UNITED STATES PATENT AND TRADEMARK OFFICE
CERTIFICATE OF CORRECTION

PATENT NO.         : 7,586,126 B2
APPLICATION NO.    : 11/531234
DATED              : September 8, 2009
INVENTOR(S)        : Shu Jung Yang and Ra Min Tain It is certified that error appears in the above-identified patent and that said Letters Patent is hereby corrected as shown below:

Title Page item 75 should read TAIN, Ra Min.

Signed and Sealed this

Tenth Day of November, 2009

David J. Kappos
*Director of the United States Patent and Trademark Office*

(12) INTER PARTES REEXAMINATION CERTIFICATE (933rd)

United States Patent
Yang et al.

(10) Number: US 7,586,126 C1
(45) Certificate Issued: Aug. 11, 2014

(54) LIGHT EMITTING DIODE LIGHTING MODULE WITH IMPROVED HEAT DISSIPATION STRUCTURE

(75) Inventors: Shu Jung Yang, Tainan County (TW); Ra Min Tain, Taipei County (TW)

(73) Assignee: Industrial Technology Research Institute, Judung Township, Hsinchu County (TW)

Reexamination Request:
No. 95/002,134, Sep. 4, 2012

Reexamination Certificate for:
Patent No.: 7,586,126
Issued: Sep. 8, 2009
Appl. No.: 11/531,234
Filed: Sep. 12, 2006

Certificate of Correction issued Nov. 10, 2009

(30) Foreign Application Priority Data

Jul. 26, 2006 (TW) ................. 95127256 A

(51) Int. Cl.
*H01L 33/00* (2010.01)
*H01L 23/46* (2006.01)

(52) U.S. Cl.
USPC .............. 257/88; 257/99; 257/713; 257/714; 257/E23.097; 257/E33.055; 257/E33.075; 362/555

(58) Field of Classification Search
None
See application file for complete search history.

(56) References Cited

To view the complete listing of prior art documents cited during the proceeding for Reexamination Control Number 95/002,134, please refer to the USPTO's public Patent Application Information Retrieval (PAIR) system under the Display References tab.

*Primary Examiner* — Minh Nguyen

(57) ABSTRACT

A light emitting diode (LED) lighting module with an improved heat dissipative structure comprises a plurality of the LEDs and a heat pipe apparatus on which at least a circuit layer is provided. The circuit layer is directly formed on an electrical insulation layer with superior heat conductivity on a surface of the heat pipe apparatus. The LEDs are electrically connected to the circuit layer. Furthermore, the heat pipe apparatus can be a flat heat pipe or the combination of plate-shaped heat pipes, heat sinks and a fan. Because the LEDs are directly mounted on the surface of the heat pipe apparatus, the heat generated by the lighting LEDs is effectively delivered to the atmosphere due to the reaction of latent heat phase transformation in the heat pipe apparatus. Moreover, the heat is delivered to the heat sinks at far sides for beat exchange so that improved heat dissipation and a space saving result are achieved.

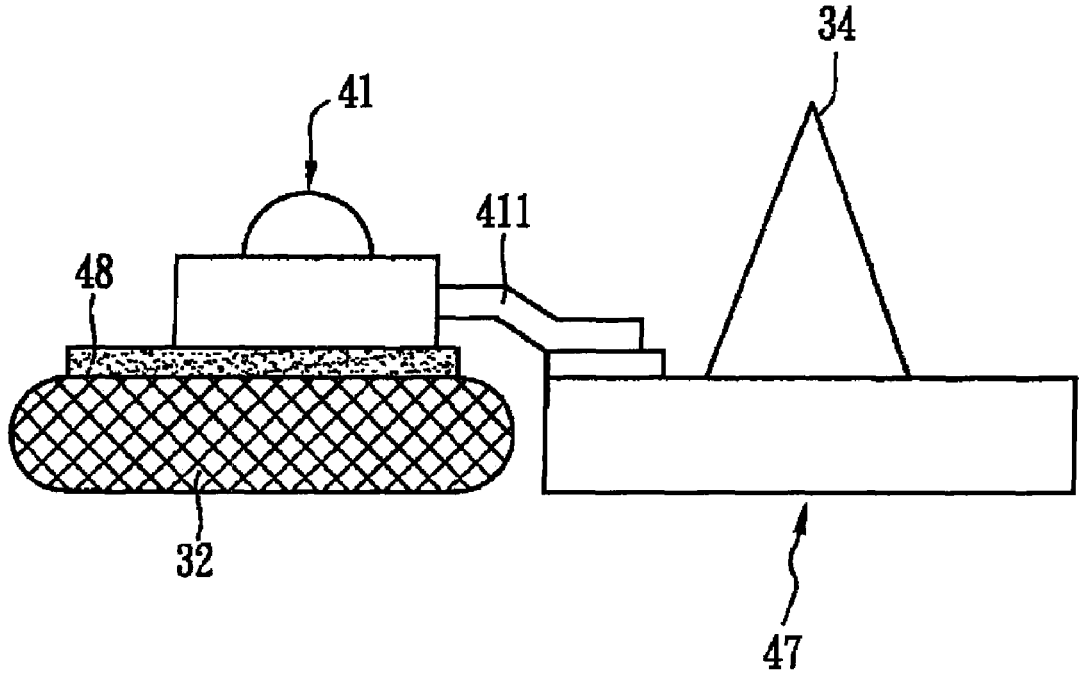

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1, 6, 11 and 15 are cancelled.
Claims 2-5, 7-10, 12-14 and 16-22 were not reexamined.

* * * * *